United States Patent [19]
Yoshioka et al.

[11] Patent Number: 5,389,497
[45] Date of Patent: Feb. 14, 1995

[54] METHOD FOR FORMING PATTERNED SOLDER MASK

[75] Inventors: Mitsuo Yoshioka, Hirakata; Yoshikazu Yamagami, Neyagawa; Akio Kashihara, Hirakata; Kiyomi Sakurai, Yawata, all of Japan

[73] Assignee: Nippon Paint Co., Ltd., Osaka, Japan

[21] Appl. No.: 70,791

[22] Filed: Jun. 3, 1993

[30] Foreign Application Priority Data

Jun. 3, 1992 [JP] Japan .................. 4-142549

[51] Int. Cl.⁶ .................. G03F 7/16; G03F 7/26
[52] U.S. Cl. .................. 430/315; 430/329; 430/330; 430/311

[58] Field of Search .............. 430/311, 313, 315, 319, 430/324, 329, 330, 935

[56] References Cited

U.S. PATENT DOCUMENTS 4,506,004  3/1985  Sullivan .................. 430/311
5,206,116  4/1993  Daniels .................. 430/315

Primary Examiner—Marion E. McCamish
Assistant Examiner—Kathleen Duda
Attorney, Agent, or Firm—Wenderoth, Lind & Ponack

[57] ABSTRACT

The present invention provides an improved method for forming a patterned solder mask having preferred electric insulating property, heat resistance-and chemical resistance on a printed circuit board with high resolution.

4 Claims, 1 Drawing Sheet

METHOD FOR FORMING PATTERNED SOLDER MASK

FIELD OF INVENTION

The present invention relates to a method for forming a patterned solder mask on a printed circuit board.

BACKGROUND OF THE INVENTION

Solder mask is generally formed on a conductor circuit, in order to keep insulation between multiple conductor circuits on the printed circuit board, to protect the conductor circuits from peeling off or oxidation or to prevent unnecessary adhesion of solder to the conductor circuits during soldering work, etc.

As the method to form the solder mask, screen printing method has been generally practiced. The screen printing method, however, is inherently of low resolution power and easy to bring about some defects, such as thin spot, pinhole, breeding and blur. In the case of high density printed circuit boards which have been used in recent years, it is necessary to form the solder mask with high precision and therefore the conventional screen printing method is not satisfactory.

A method has been proposed wherein a photosensitive thermosetting resin composition is coated on a circuit board and a desired pattern is then formed by photographic method, followed by curing by heat to form a cured pattern which is used as the solder mask (see Japanese Kokai Publications Sho 63-286841, Hei 2-28651 and Hei 2 -77749).

In the conventional technology to form the solder mask by the photographic method, a photosensitive thermosetting resin composition is used for forming the solder mask and is therefore prepared from material having both photocurable functional group and thermocurable functional group in the same molecule. In the case of the photosensitive resin composition comprising such materials, number of thermocurable functional groups contained in the resin composition is smaller than the other thermosetting resin compositions which only has thermocurable functional groups. Thus, the thermosetting resin composition used in the photographic method has low heat curing degree and is inferior in performances as solder mask, such as electric insulating property, heat resistance and chemical resistance and the like.

In recent years, it is desired that electrical contacting points are gold-plated in order to reduce electrical resistance. If the gold plating is conducted after forming the solder mask, the solder mask is required to have chemical resistance sufficient to withstand the gold-plating liquid. However, the solder mask formed by the conventional photographic method does not have sufficient chemical resistance to gold plating.

SUMMARY OF THE INVENTION

The present invention solves the aforesaid conventional problems and its objective is to provide the method for forming a patterned solder mask having preferred electric insulating property, heat resistance and chemical resistance on a printed circuit board with high resolution.

The present invention provides a method for forming a patterned solder mask on a surface of a printed circuit board comprising an insulating substrate and an electro-conductive circuit thereon, which comprises the following steps:

(1) the step to form on the surface of the printed circuit board a layer of a negative or positive type photosensitive resin composition;
(2) the step to cure the region not forming the solder mask by UV-ray irradiation of thus formed photosensitive resin layer;
(3) the step to remove the uncured region of said photosensitive resin layer;
(4) the step to form a thermosetting resin composition film for solder mask at the region of the surface of the printed circuit board where the uncured photosensitive resin layer has been removed, the thermosetting composition having a difference in surface tension by 5 dyne/cm or more from the cured photosensitive resin composition layer;
(5) the step to cure the thermosetting resin composition by heating; and
(6) the step to remove photosensitive resin layer.

According to the method of the present invention, the pattern forming function is assigned to the photosensitive resin composition and the solder masking function is assigned to the thermosetting resin composition.

DETAILED DESCRIPTION OF THE INVENTION

Figure 1A:
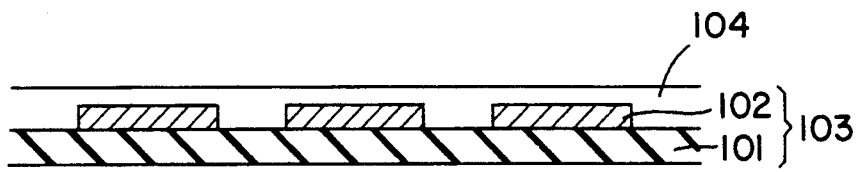
FIG. 1, sections (a)–(e) indicate an example of a method to form a patterned solder mask according to the present invention.
Figure 1B:
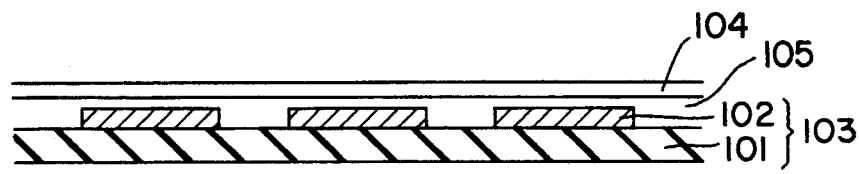
Figure 1C:
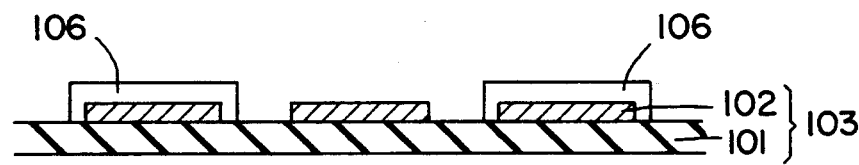
Figure 1D:
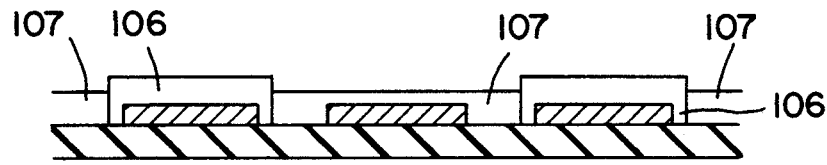
Figure 1E:
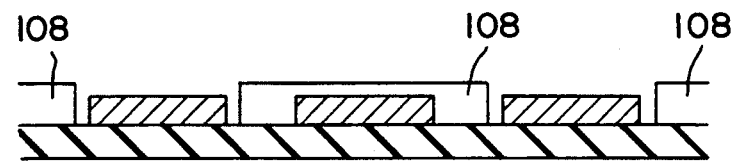

As illustrated in FIG. 1, section (a), a film 104 of a photosensitive resin composition is formed on a surface of a printed circuit board 103 which is composed of an electric circuit 102 on a glass-epoxy substrate 101. The photosensitive resin composition used in the present invention has photosensitivity better than that of the conventional photosensitive thermosetting resin composition. Preferably, the resin composition has photosensitivity of 300 mj/cm$^2$, preferably 100 mj/cm$^2$.

The photosensitive resin composition may be provided directly on the printed circuit board, but if adhesion is insufficient, it is preferred to form a primer layer 105 beforehand as indicated in FIG. 1, section (b). The composition for the primer is required to have good adhesion to both epoxy and copper which are used for the printed circuit board and also to have good adhesion to the photosensitive resin layer. Therefore, the primer composition is preferred to have a surface tension of about 25–45 dyne/cm. When a photopolymerizing composition is used as the primer composition, it provides a powerful effect to increase the adhesion between the primer layer and the printed circuit board.

Subsequently, the formed photosensitive resin layer is selectively irradiated by UV ray to cure the region of the printed circuit board where no solder mask is to be formed. Selective irradiation of UV ray may be executed according to the ordinary method practiced in the industry. For instance, the method to irradiate UV ray through a pattern mask (positive pattern or negative pattern mask) is generally practiced.

As the result of forming an image by UV ray irradiation, the unexposed region remains as an uncured region if a photopolymerizing photosensitive resin (i.e. negative photosensitive resin) is used. If a photodecomposing photosensitive resin (i.e. positive photosensitive resin) is used, the exposed region remains as an uncured region. Thereafter the photosensitive resin layer 104 and the primer layer 105 (not indicated in FIGS. 1, sections (c) to (e)) are removed to form the pattern 106 of the cured photosensitive resin layer as illustrated in FIG. 1, section (c). The removal of the photosensitive resin layer may be conducted by an alkali liquid (e.g. sodium carbonate liquid) or an organic solvent (e.g. propylene glycol derivative or carbitol liquid) for the negative type photosensitive resin layer, and an alkali liquid for the positive type photosensitive resin layer.

After drying the surface of the printed circuit board where the pattern 106 of the cured photosensitive resin layer has been formed, a thermosetting resin composition for solder mask is applied on it to form a solder mask 107 in the region where the uncured photosensitive resin layer has been removed (see FIG. 1, section (d)).

Finally, the pattern 106 of the cured photosensitive resin layer is removed to form the solder mask pattern 108 as shown in FIG. 1, section (e). The removal of the pattern 106 is conducted by an appropriate organic solvent or a strong alkali liquid. Examples of the organic solvents are carbitols, such as diethylene glycol monomethyl ether and diethylene glycol dimethyl ether; cellosolves, such as ethylene glycol monomethyl ether and ethylene glycol monoethyl ether; propylene glycol derivatives; dimethyl formamide; dimethylsulfoxide; N-vinyl pyrrolidone; and the like. Examples of the strong alkali are sodium hydroxide, potassium hydroxide and the like.

Removal of the cured photosensitive resin layer is executed by bringing the aforesaid solvent in contact with the photosensitive resin layer by an appropriate method such as immersion or spray. It may be removed by using a physical method such as rubbing or brushing with sponge or rubber, if necessary.

According to the present invention, it is important that the difference in surface tension between the photosensitive resin layer and the solder mask (thermosetting resin) composition is 5 dyne/cm or more, preferably 8 dyne/cm or more. This difference of surface tension is given by art-known methods. For example, a silicone resin or a fluororesin may be formulated into either the photosensitive resin composition or the thermosetting resin composition. Also, a polymer component used in either resin compositions may be modified by introducing perfluoroalkyl groups or siloxane groups. The photosensitive and thermosetting resin compositions before the formulation or modification can be the same as conventionally used. The conventional resin compositions will be explained first and then the formulation or modification will be set forth hereinafter.

The conventional photosensitive resin composition can be prepared by mixing the components indicated in (i), (ii) and (iii) below in the case of negative type.

(i) Photopolymerizable resin: for instance, an epoxyacrylate obtained by reacting an oxirane ring of a bisphenol type or novolac type epoxy resin with a compound both having an unsaturated double bond and a carboxylic group, such as (meth)acrylic acid; an acrylic resin obtained by adding a polymerizable unsaturated fatty acid to an acrylic resin having an epoxy group or by adding a glycidyl ester of unsaturated fatty acid or an unsaturated fatty acid hydroxyalkyl ester to an acrylic resin having a carboxyl group; a polyester resin obtained by reacting a polyester resin having a carboxyl group or hydroxyl group with a glycidyl ester of unsaturated fatty acid, (meth)acryloyl isocyanate or (meth) acrylic chloride etc.; a diazo resin obtained by condensing a diazonium salt and a formaldehyde; photosensitive resins disclosed in Japanese Kokai Publication Hei 4-26849, Hei 4-60549; a mixture thereof; and the like.

(ii) Radical-polymerizable monomer or oligomer preferably in liquid form: for instance, ethyleneglycol di(meth)acrylate, polyethyleneglycol di(meth)acrylate, hexanediol di(meth)acrylate, trimethyrolpropane tri(meth)acrylate, tetramethylolmethane tetra(meth)acrylate, dipentaerythritol hexa(meth)acrylate, tris(2-(meth)acryloxyethyl) isocyanurate, oligo-urethane (meth)acrylate and oligo-epoxy (meth)acrylate, a mixture thereof and the like.

(iii) Photopolymerization initiator: for instance, benzoine alkyl ether type, anthraquinone type, benzophenone type, methylene blue type and xanthone type initiators, including benzoyl dimethyl ketone, benzophenone, benzoyl isopropyl ether, benzoyl dimethyl ketal, 2,2-dimethoxy-2-phenyl acetophenone, benzophenone and 2,4-diethylthioxanthone, a mixture thereof and the like.

The photopolymerizable resin (i) may be used in an amount of 50-98% by weight, preferably 60-90% by weight. The radical polymerizable monomer or oligomer (ii) may be used in an amount of 0-70% by weight, preferably 10-40% by weight. An appropriate amount of the photopolymerization initiator (iii) may be 0.1-10% by weight in view of the efficiency and cost. The percentage is based on the amount of the photosensitive resin composition.

The photosensitive resin composition of the present invention may further contain a non-photosensitive resin, such as epoxy resin, acrylic resin, polyester resin, polyether resin, phenolic resin, polyvinyl alcohol, polyamide resin etc. in an amount of up to 0-80% by weight based on the total amount of the resin composition. When the amount of the non-photosensitive resin exceeds 80% by weight, photosensitivity and developing ability may often reduce.

In addition to the above, some additives may be formulated into the composition. Typical examples of the additives are fluidizing agent, repelling preventing agent and stabilizer, if necessary.

As the positive type photosensitive resin composition, a photodecomposing resin may be employed. Examples of the photodecomposing resins are those having quinonediazides, such as benzoquinonediazide or naphthoquinonediazide. The resin is generally prepared by reacting a resin containing hydroxy groups with 1,2-quinonediazidation agent, as disclosed in the Japanese Kokai Patent Sho 62-178562. The resin having hydroxyl groups includes epoxy resin, acrylic resin, polyester resin, phenolic resin and the like.

The primer composition, as mentioned above, is used for enhancing adhesion between the photosensitive resin layer and the printed circuit board. Any resin composition can be used as long as it function the purpose. Typically, the composition is preferably composed of such resins as acrylic resin, polyester resin, epoxy resin, polyvinyl alcohol and polyamide resin as well as such resins added with radical-polymerizing functional group, modified resins to which polymerizable group, fluorinated alkyl group or silicon element etc. has been introduced.

The method of forming the primer layer and the photosensitive film may be normally used in the film forming industry, for instance, spray coating, roller coating, screen coating, curtain coating, dip coating, draw coating, melt coating, laminate coating, and the like.

Thickness of the primer layer is normally 1–5 μm. The photosensitive resin layer may have a thickness which enables pattern forming by UV ray irradiation. Generally, it is up to about 100 μm, preferably 20 to 100 μm, more preferably 30 to 80 μm.

The thermosetting resin composition for solder mask to be used in the present invention may preferably be epoxy resin. The epoxy resin gives high crosslink density and therefore keeps insulation between the conductor circuits of the printed circuit board, protects the conductor circuit from peeling or oxidation and prevents unnecessary adhesion of solder to the conductor circuit in the soldering work. The thermosetting resin composition may also be a resin composition having hydrosilylizing heat reaction system because of high electric insulation. The hydrosilylizing resin composition generally comprises a resin having alkenyl groups, a polyhydrodiene siloxane and a transition metal catalyst whereby generating hydrosilylizing reaction. The resin having alkenyl groups includes an epoxy resin, an acrylic resin, an polyester resin and an ether resin, which contain at least two alkenyl groups. Among them, an acrylic resin having alkenyl groups is preferred, including an addition polymer prepared from a monomer having an alkenyl group (e.g. allyl (meth)acrylate, cyclohexenylmethyl (meth)acrylate and 2-butenyl acryiate), the above mentioned photosensitive acrylic resin and a radically polymerizable monomer and oligomer. Examples of the polyhydrodiene siloxanes are methylhydrosiene silicone oil (e.g. SH1107 available from Toray Dow Silicone Co., Ltd.), ω-bis(-hydrodiene)polydimethyisiloxane (e.g. TSL 9546 and TSL 9586 both available from Toshiba Silicone Co., Ltd.) and the like. Typical examples of the transition metal catalysts are platinum catalyst having 0 or 4 valent, especially platinate chloride. The thermosetting resin composition may also be prepared from an acrylic resin, phenolic resin, polyester resin -or their modified resins may also be used.

The resin composition for the solder mask is required to be thermosetting. Curing of resin generally occurs in such way that the functional groups of the resin react independently or mutually or the functional groups of additional curing agent react with the functional groups of the resin.

The thermosetting resin composition is preferred to be in liquid form and it may be either aqueous or solvent based. However as aforesaid, the thermosetting resin composition should be incompatible with the cured photosensitive resin layer and it should make layer separation from the cured photosensitive resin. The term "thermosetting resin composition" herein used also includes the thermosetting resin composition, viscosity of which has been adjusted by addition of diluent solvent.

The aqueous thermosetting resin composition includes emulsion polymerization polymer, suspension polymerization polymer, resin emulsified by water-soluble resin and surface active agent and the colloidal dispersed resin obtained by neutralizing the acid group or basic group by an appropriate neutralizing agent. To take an example of epoxy resin, the epoxy resin emulsion, the epoxy resin obtained by mixing liquid epoxy resin or epoxy resin varnish with an aqueous solution of anionic and/or nonionic surfactant under stirring and the artificially-emulsified emulsion may be profitably used.

The solvent based thermosetting resin composition includes the solid resin dissolved in an appropriate solvent and the synthesized resin varnish. In order to ensure sufficient layer separation from the photosensitive resin layer after curing, the solvent includes aromatic hydrocarbons, such as toluene and xylene; esters, such as ethyl acetate and butyl acetate; ketones, such as methyl ethyl ketone and methyl butyl ketone; ethers, such as dimethyl ether and tetrahydrofuran; mixtures thereof; and the like.

For forming a film of the thermosetting resin composition on the surface of the printed circuit board, roughly the same method as the one applied to the case of photosensitive composition may be used. However, it is preferred not to use lamination method, because layer separation of photosensitive resin layer and thermosetting resin film must be performed subsequently. It is preferred to make the thickness of the thermosetting resin composition smaller than that of the photosensitive resin layer. When the thickness of the solder mask obtained by curing the film of the thermosetting resin composition is larger than that of the photosensitive resin layer, the photosensitive resin layer is covered by the solder mask and thus the subsequent removal of photosensitive resin layer becomes difficult.

By heating the thermosetting resin composition formed at the surface of the printed circuit board, a cured solder mask is formed. Heating must be made so that temperature is kept at the level above the temperature where the aforesaid reactive functional groups can react. Usually it is held at above 140° C. When the heat resistance of the substrate made of glass epoxy resin is taken into account, the temperature had better be kept at above 160°–180° C.

As mentioned above, the difference of surface tension between the photosensitive resin layer and the thermosetting resin composition should be 5 dyne/cm or more. Therefore, when preparing the thermosetting resin composition by diluting the component with a dilution solvent, it is preferred to select the thermosetting resin composition and diluent solvent which have the difference in surface tension ($\Delta ST$) of more than 5 dyne/cm between the cured photosensitive resin layer and thermosetting resin composition. Surface tension of the cured photosensitive resin layer means a lowest index measured under such conditions that the standard wetting index liquid (manufactured by Wako Junyaku K.K.) can be drawn linearly on the photosensitive resin layer without causing shrinking of the standard liquid. The surface tension of the thermosetting resin composition means the measured value obtained a Kyowa CBVP type surface tension meter (manufactured by Kyowa Kaimen Kagaku K.K.).

In order to give the difference of surface tension, it is proposed that an acrylic resin having perfluroalkyl group, an acrylic resin having siloxane groups, a fluororesin or a silicone resin is formulated into either the photosensitive resin composition or the thermosetting resin composition. Typical examples of such resins are Asahi Guard HG710 (manufactured by Asahi Glass Co.) or silicone acryl emulsion (BY 22-832: manufactured by Toray, Dow Corning Corp.).

An amount of the above resin is not particularly restricted but it is preferred to be more than 20% by weight, preferably 30 to 50% by weight based on the total weight of the resin composition. If the content of the resin is less than 20 wt %, it is difficult to provide sufficient difference in surface tension between the cured photosensitive resin layer and the thermosetting resin composition. As the result, layer separation between the cured photosensitive resin layer and thermosetting resin composition may sometimes become insufficient. Thus, it becomes difficult to remove the photosensitive resin pattern after forming the solder mask. Resolution of the formed solder mask pattern also deteriorates.

To make the difference of surface tension, perfluoroalkyl groups or siloxane groups may be introduced into the resin to be formulated into either the photosensitive resin composition or the thermosetting resin composition. A content of the perfluoro alkyl group or the siloxane groups in the resin preferably is $10^{-2}$ to 10 wt % in terms of F or Si atom. There is no restriction to the concentration of perfluoroalkyl group or siloxane group, but it is necessary that the surface tension is sufficiently low and it exhibits water-repellency or oil-repellency. Introduction of the perfluoroalkyl groups or siloxane groups is known to the art, for example a method wherein an acrylic monomer having a perfluoro group or a siloxane group is polymerized optionally with other copolymerizable monomers, or a method wherein a resin having hydroxyl group therein is reacted with a fluoroalkylsilane or an alkoxysilane of polysiloxane. In addition to the above, the photosensitive silicone resin or photosensitive fluororesin disclosed in the Japanese Kokai Patent Hei 3-170550 or Hei 3-166229 may be profitably used. Examples of the above fluoroalkoxysilanes are $CF_3CH_2CH_2Si(OCH_3)_3$, $CF_3CH_2CH_2SiCl_3$, $CF_3(CF_2)_5CH_2CH_2SiCl_3$, $CF_3(CF_2)_6CH_2CH_2Si(OCH_3)_3$, $CF_3(CF_2)_7CH_2CH_2SiCl_3$, $CF_3(CF_2)_7CH_2CH_2Si(OCH_3)_3$ and the like.

EXAMPLES

The present invention is described in further detail in reference to the following examples, but the present invention is in no way construed to be limited by such description.

EXAMPLE 1

A mixture solution of 100 parts by weight of Asahi Guard AG710 (fluororesin emulsion manufactured by Asahi Glass Co.) and 100 parts by weight of a diazo resin (Diazo No. 4L manufactured by Fairmount Chemical Co.) was coated on a printed circuit board on which a conductor circuit had been drawn, by airspray and then dried at 60° C. The surface tension of the formed photosensitive resin layer was 27 dyne/cm. A film with a negative image was applied to the surface of the photosensitive resin layer by vacuum and it was exposed to a high pressure mercury lamp. Subsequently, the printed circuit board was-placed in-a high pressure water spray device and was developed by water mist. The obtained printed circuit board was dried to completely remove water.

Separately, 100 parts by weight of liquid epoxy resin (Epicoat 828 manufactured by Yuka-Shell Epoxy Co.), 10 parts by weight of 2-vinyl-4,6-diaminotriazine, 1 part by weight of 2,4-diamino-6-(2'-methylimidazol) ethyltriazine, 10 parts by weight of polyvinyl-p-phenol, 20 parts by weight of talc, 60 parts by weight of barium sulfate, 2 parts by weight of a dispersant (Disparon NS30 manufactured by Kusumoto Kasei K.K.), 0.5 parts by weight of a defoaming agent (KS603 manufactured by Sekisui Chemical Co.) and 10 parts by weight of butyl carbitol acetate were dispersed and kneaded to the crude particle size of less than 10 micron by a three-roll mill to obtain a thermosetting resin composition. The composition was diluted with methyl isobutyl ketone to adjust to an air-less sprayable viscosity. Surface tension of thus obtained thermosetting resin composition was 38 dyne/cm.

Subsequently, the thermosetting resin composition was coated on the substrate for the uniform thickness of 35 μm. After drying at room temperature, it was baked for 30 minutes at 140° C. Then the continuous film of thermosetting resin was formed on the printed circuit board at the region where no photosensitive resin layer exists.

Subsequently, the substrate was immersed in a mixed solution of xylene and methoxypropanol acetate and rubbed lightly by a roller brush to remove the photosensitive resin layer. Thus obtained printed circuit board was evaluated as to its resistance to soldering heat, chemical resistance, electric insulation property and resistance to electroless plating. The results are shown in Table 1.

Method of Evaluation

1) Soldering heat resistance: The specimen was immersed in a molten solder bath at 260° C. for 30 seconds and observation of swelling, peeling etc. of the coated film was made and cross cut peeling evaluation was made according to JIS-D-0202.
2) Chemical resistance: The specimen was immersed in a 10% sulfuric acid solution and a 10% sodium hydroxide solution for 120 hrs. and change of coated film was observed.
3) Electric insulation property: The film was impressed with 500 V and held under such state for one minute and then its resistance was measured by resistance meter.
4) Resistance to electroless plating: The specimen was gold-plated in a thickness of about 0.1 μm by immersion in plating bath of electroless gold and change of the coated film was observed and adhesion was visually inspected by tape peeling method.

EXAMPLE 2

Instead of Asahi Guard AG710, a mixture solution of 100 parts by weight of a silicone acryl emulsion (BY22-832 manufactured by Toray-Dow Corning Co.) and 150 parts by weight of a diazo resin (Diazo No. 4L manufactured Fairmount Chemical Co.) was used while the rest of the process was conducted in the same way as in Example 1 and a solder mask pattern was formed at the surface of the printed circuit board. Surface tension of thus formed photosensitive resin layer was 28 dyne/cm. Thus obtained printed circuit board was evaluated as to its soldering heat resistance, chemical resistance, electric insulation property and resistance to electroless plating. The results of evaluation are shown in Table 1.

EXAMPLE 3

An acrylic resin was prepared from 40 parts by weight of trifluoroethyl methacrylate and 30 parts by weight of methacrylic acid in methoxypropanol acetate. To the acrylic resin, 30 parts by weight of glycidyl methacrylate was reacted to form a photosensitive acrylic resin with average 6 mole of double bond in one molecule, a number average molecular weight of 2800 and an acid value of 80 and a solid content of 60%.

With 140 Parts by weight of the said photosensitive acrylic resin, 15 parts by weight of trimethylolpropane triacrylate and 6 parts by weight of a photopolymerization initiator (IRG-651 manufactured by Ciba Geigy Co.) were mixed and diluted with butyl acetate to adjust to sprayable viscosity. It was coated on a same printed circuit board as the one used in Example 1 and it was dried. Subsequently, the film with negative image was applied tightly to the surface of the substrate by vacuum, it was irradiated to a high pressure mercury lamp and unirradiated part was removed by high pressure spraying of a 1% sodium carbonate solution. Surface tension of thus formed photosensitive resin layer was 33 dyne/cm.

Thus obtained printed circuit board was dried and moisture was completely removed.

Separately, 100 parts by weight of a liquid form epoxy resin (Epicoat 828 manufactured by Yuka-Shell Epoxy Co.), 15 parts by weight of 2-vinyl-4,6-diaminotriazine, 1.5 parts by weight of 2,4-diamino-6-(2'-methylimidazolyl) ethyltriazine, 10 parts by weight of polyvinyl-para-phenol, 20 parts by weight of talc, 60 parts by weight of barium sulfate, 2 parts by weight of a dispersant (Disparon NS630 manufactured by Kusumoto Kasei K.K.), 0.5 parts by weight of a defoaming agent (K5603 manufactured by Shin-Etsu Chemical Co.) and 10 parts by weight of butyl carbitol acetate were dispersed and knead to a particle size of less than 10 $\mu$m using a three-roll mill to prepare a thermosetting resin composition. Thus obtained mixture was mixed under stirring with the aqueous solution of surfactant obtained by dissolving 2 parts by weight of an artionic surfactant (Lebenol WZ manufactured by Kao Co.) into 200 parts by weight of deionized water to obtain the emulsion of a thermosetting resin composition. Surface tension of thus obtained thermosetting resin composition was 42 dyne/cm. It was spray-coated on the dry printed circuit board. By drying, a continuous film was prepared and then it was baked at 140° C. for 30 minutes. After cooling, the substrate was immersed in a 5% sodium hydroxide solution and by light brushing, photosensitive resin layer was completely removed.

The resulting printed circuit board was evaluated in regard to its soldering heat resistance, chemical resistance, electric insulation property and resistance to electroless plating property. The results of evaluation are shown in Table 1.

EXAMPLE 4

An acrylic resin varnish was prepared from 50 parts by weight of trifluoroethyl methacrylate, 7.7 parts by Weight of methacrylic acid, 25 parts by weight of methyl methacrylate and 17.3 parts by weight of ethyl acrylate in methoxypropanol acetate. Acid value of the solid part of the acrylic resin was 50 mg KOH/g, number average molecular weight was 6,500 and solid content of varnish was 60%.

A photosensitive resin composition was prepared by dissolving 20 parts by weight of the varnish obtained above and 3 parts by weight of 1,2-naphthoquinonediazide-5-sulfonic acid ester of 2,3,4-trihydroxy benzophenone into a mixture solvent of 60 parts by weight of methoxypropyl acetate and 18 parts by weight of methyl ethyl ketone. The photosensitive resin layer with surface tension of 32 dyne/cm was formed using thus obtained photosensitive resin composition and the rest of the process was performed in the same manner as in Example 3 to prepare a printed circuit board with a solder mask pattern at the surface. The printed circuit board was evaluated in regard to its soldering heat resistance, chemical resistance, electric insulation property and resistance to electroless plating. The results of evaluation are shown in Table 1.

EXAMPLE 5

An acrylic resin varnish was prepared from 10 parts by weight of trifluoroethyl methacrylate, 17 parts by weight of methyl methacrylate, 15 parts by weight of n-butyl methacrylate, 13 parts by weight of 2-hydroxyethyl acrylate and 20 parts by weight of acrylic acid, to which 25 parts by weight of glycidyl methacrylate was addition-reacted to obtain a methoxypropanol acetate solution of a photosensitive acrylic resin with solid content of 60%.

Subsequently, 10 parts by weight of trimethylolpropane diacrylate was mixed with 100 pads by weight of the resin varnish obtained above and coated as a primer on the surface of a printed circuit board.

Subsequently, in the same manner as in Example 3, a printed circuit board with solder mask pattern at the surface was prepared. The resulting printed circuit board was evaluated as to its soldering heat resistance, chemical resistance, electric insulation property and resistance to electroless plating. The results of evaluation are shown in Table 1.

EXAMPLE 6

A photosensitive resin composition was prepared as generally described in Example 4, with the exception that 50 parts by weight of dimethylsilicone macromonomer (Sairaplane FM-0711 available from Tisso Co.) was employed instead of 50 parts by weight of trifluoroethyl methacrylate. The resin composition had a surface tension of 30 dyne/cm and the same evaluations were conducted. The results are in Table 1.

EXAMPLE 7

An acrylic resin was prepared from 25 parts by weight of methyl methacrylate, 15 parts by weight of n-butyl methacrylate and 30 parts by weight of methacrylic acid in methoxypropanol acetate. To the acrylic resin, 30 parts by weight of glycidyl methacrylate was reacted to form a photosensitive acrylic resin having an average 6 mole of double bond, a number average molecular weight of 2,800, an acid value of 80 and a solid content of 60%.

Next, 140 parts by weight of the photosensitive acrylic resin was mixed with 16 parts by weight of trimethylolpropane triacrylate and 6 parts by weight of a photoinitiator (IRG-651 available from Ciba Geigy Co.), and then diluted with butyl acetate to a sprayable viscosity. The composition was coated on a same printed circuit board as Example 1, and dried. It was then contacted with a film having a negative image under vacuum, and exposed to a high pressure mercury lamp. It was then contacted with a 1% sodium carbonate solution by high-pressure spraying to remove the non-exposed portion. The resulting patterned photosensitive resin layer had a surface tension of 39 dyne/cm. The resulting printed circuit board was dried to remove water completely.

Separately, an acrylic varnish was prepared from 80 parts by weight of 2-butenyl methacrylate and 20 parts by weight of t-butyl methacrylate in methoxypropanol. The resulting resin had a number average molecular weight of 7,000 and a solid content of 60%. Then, 30 parts by weight of the resulting acrylic resin varnish was mixed with 6.2 parts by weight of methylhydrodiene silicone oil (available from Toray Dow Corning Silicone Co. as SH 1107), 1.2 parts by weight of a 1 wt % isopropanol solution of platinum acid chloride and 14 parts by weight of sedimented barium-sulfate, and applied on the dried printed circuit board by spraying. It was heated at 150° C. for 30 minutes to obtain a heat cured coating. The heat cured coating had a surface tension of 29 dyne/cm. It was then cooled, and immersed in a 3% sodium hydroxide solution with lightly brushing to remove the photosensitive resin layer. The same evaluations were conducted and the results are shown in Table 1.

COMPARATIVE EXAMPLE 1

A solder mask pattern was formed in the same manner as in Example 3 except that a photosensitive resin layer with surface tension of 38 dyne/cm was formed using the composition which was used as the primer in Example 5. In spite that the pattern was immersed in releasing off liquid and brushed, the solder mask remained at the part where the film is unnecessary. Thus the solder mask pattern having sufficient resolution was not formed. The resulting printed circuit board was evaluated as to its soldering heat resistance, chemical resistance, electric insulation property and resistance to electroless plating. The results of evaluation are shown in Table 1.

What is claimed is:

1. A method for forming a patterned solder mask on a surface of a printed circuit board comprising an insulating substrate and an electroconductive circuit thereon, comprising the following steps:

(1) the step to form on the surface of the printed circuit board a layer of a negative or positive type photosensitive resin composition;

(2) the step to cure the region not forming the solder mask by UV-ray irradiation of thus formed photosensitive resin layer;

(3) the step to remove the uncured region of said photosensitive resin layer;

(4) the step to form a thermosetting resin composition film for solder mask at the region of the surface of the printed circuit board where the uncured photosensitive resin layer has been removed, the thermosetting composition having a difference in surface tension by 5 dyne/cm or more from the cured photosensitive resin composition layer;

(5) the step to cure the thermosetting resin composition by heating; and (6) the step to remove photosensitive resin layer.

2. The method according to claim 1 which further comprises the step to form on the surface of the printed circuit board a primer layer which increases adhesion between the photosensitive resin composition and the surface of printed circuit board, prior to forming said photosensitive resin layer on the surface of printed circuit board.

3. The method according to claim 1 wherein said negative or positive type photosensitive resin composition contains at least one kind of resin selected from the group consisting of an acrylic resin having a perfluoroalkyl group, an acrylic resin having a siloxane group, a fluororesin and a silicone resin, and said thermosetting resin composition is composed of a resin selected from the group consisting of an epoxy resin, an acrylic resin, a phenol resin, a polyester resin and a mixture thereof.

4. The method according to claim 1 wherein said negative or positive type photosensitive resin composition is composed of a resin selected from the group consisting of an acrylic resin, an epoxy resin, a polyester resin, an ether resin and a mixture thereof, and the thermosetting resin composition comprising an alkenyl group-containing resin, a polyhydrodienesiloxane and a transition metal catalyst.

* * * * *

TABLE 1

| Example No. | Surface tension (dyne/cm) | | | Results of evaluations | | | | |
|---|---|---|---|---|---|---|---|---|
| | Cured photosensitive resin layer | Thermosetting resin composition | Difference of surface tension (ΔST) | Solder heat resistance | 10% sulfuric acid resistance | 10% alkali resistance | Insulation (Ω) | Resistance to electroless plating |
| Ex. 1 | 27 | 38 | 11 | No change | No change | No change | $>10^{13}$ | No change |
| Ex. 2 | 28 | 38 | 10 | No change | No change | No change | $>10^{13}$ | No change |
| Ex. 3 | 33 | 42 | 9 | No change | No change | No change | $>10^{13}$ | No change |
| Ex. 4 | 32 | 42 | 10 | No change | No change | No change | $>10^{13}$ | No change |
| Ex. 5 | 33 | 42 | 9 | No change | No change | No change | $>10^{13}$ | No change |
| Ex. 6 | 30 | 42 | 12 | No change | No change | No change | $>10^{13}$ | No change |
| Ex. 7 | 39 | 29 | 10 | No change | No change | No change | $>10^{13}$ | No change |
| Comp. Ex. 1 | 27 | 42 | 4 | Peeling | No change | Peeling | $<10^{13}$ | Peeling |